United States Patent [19]

Sikdar et al.

[11] Patent Number: 5,104,478
[45] Date of Patent: Apr. 14, 1992

[54] METHOD FOR MAKING SINGLE CRYSTALS

[75] Inventors: Subhas K. Sikdar, Boulder; Dena L. Lund, Westminster, both of Colo.

[73] Assignee: The United States of America as represented by the Secretary of Commerce, Washington, D.C.

[21] Appl. No.: 422,705

[22] Filed: Oct. 17, 1989

[51] Int. Cl.$^5$ .......................... C30B 29/54; C30B 7/00
[52] U.S. Cl. ..................... 156/600; 156/624; 156/DIG. 113; 23/297; 23/299
[58] Field of Search ............. 156/600, 621, DIG. 113; 210/644, 652; 23/297, 299

[56] References Cited

U.S. PATENT DOCUMENTS

| | | | |
|---|---|---|---|
| 3,230,051 | 1/1966 | Sampson et al. | 156/621 |
| 3,988,486 | 10/1976 | Rhein | 23/295 R |
| 4,000,065 | 12/1976 | Ladha et al. | 210/652 |
| 4,070,291 | 1/1978 | Rhein | 210/115 |
| 4,482,459 | 11/1984 | Shiver | 210/652 |
| 4,607,070 | 8/1986 | Schreckenberg et al. | 210/652 |
| 4,618,429 | 10/1986 | Herrigel | 210/652 |
| 4,919,900 | 4/1990 | Martin et al. | 156/DIG. 113 |

FOREIGN PATENT DOCUMENTS 51-42682  4/1976  Japan .................... 210/652

OTHER PUBLICATIONS

Madjid, "Diffusion Zone Process, A New Method for Growing Crystals", The Physics Teacher, vol. 13, No. 3, pp. 176–179, Mar. 1975.
Varkey et al., "Growth of Single Crystals from Solutions Using Semi-Permeable Membranes", Journal of Crystal Growth, 61 (1983), pp. 701–704.
Sieker, "Interesting Observations on the Nature of Protein Crystals and Their Growth", Journal of Crystal Growth, vol. 90 (1988), pp. 31 to 38.

Primary Examiner—Robert Kunemund
Attorney, Agent, or Firm—I. William Millen; Donald E. Townsend

[57] ABSTRACT

A method for making single crystals, comprising osmotically removing the solvent from a solution containing the material to be grown into a crystal.

14 Claims, 3 Drawing Sheets

METHOD FOR MAKING SINGLE CRYSTALS

BACKGROUND OF THE INVENTION

The ability to reliably make large, perfect single crystals of various materials ranging from simple organic chemicals to complex macromolecules such as proteins and nucleic acids has long been an elusive goal in a wide variety of fields. The lengths which have been gone to in quest of that goal include setting up experiments which are designed to last weeks and even months, specially designed vibrationless rooms, complex equipment for countering convection currents and gravity, and even setting up experiments in the depths of outer space. There have been numerous attempts to solve this problem, which have met with varying degrees of success, but all of which suffer from drawbacks which limit their application widely, inexpensively, or reliably.

In order to make crystals, the material of interest is usually dissolved in a solvent and the solubility of the material is decreased, usually very gradually, in one of a number of ways, including increasing the salt concentration of the solution, evaporating off the solvent or cooling the solution. Alternatively, crystallization is induced by adding a seed crystal of purified material (if it is available) or by creating some other nucleus of crystallization. However, more often than not, either the material will not crystallize at all, i.e., it merely precipitates out of solution in an amorphous condition or simply dries, or, if crystals are formed, they are small, imperfect and/or not suitable for the purpose for which they were intended.

The range of utilities of single crystals is vast, and varies with the nature of the material as well as the size and purity. Crystals themselves may have utility, for example, as semiconductors and as other components used to process electrical or electromagnetic energy or optoelectronic signals. A very important utility is the study of crystals themselves as a tool for learning about the structure of the molecule of interest. Especially in the case of complex macromolecules, structural information is best achieved by X-ray diffraction studies, which require the use of single crystals. Protein single crystals, in particular, are essential for uncovering the three dimensional structure, or conformation, of the protein by X-ray crystallography. The entire field of protein engineering is built upon, and thus far limited to, knowledge obtained from X-ray crystallography. Protein engineering is the emerging science that enables one to alter protein and enzyme structures to impart desirable properties, useful to man but unobtainable naturally. For an enzyme (which is also a protein), the structure provides valuable information about why and how the enzyme works, and how one can improve it by protein engineering. Also, the three dimensional structural information is essential for drug design. A further utility of the process of this invention is the production of single crystal of zeolites, which may offer significantly improved selectivity in catalysis.

One problem of growing crystals, especially single protein crystals, is that there is no universally accepted standard method. Typically, different laboratories use different techniques and different source materials for the same protein. A coherent paradigm that provides a rational set of rules for protein crystal growth methods is acutely needed.

Protein crystallization is practiced commercially for three main purposes: purification, storage, and structure determination. For purification and storage, the crystals are relatively easy to grow and need not be large single crystals. Conversely, large single crystals are required for X-ray studies. In industrial applications for storage and purification, crystals do not need to be structurally pure, i.e., imperfections in their structures frequently do not interfere at all with economic value. Protein single crystals, however, must have very high degrees of structural purity for providing X-ray diffraction resolution adequate for accurate determination of three dimensional molecular network structure. For this reason, the strategy for making single crystals of proteins is to suppress nucleation, to provide only a few crystals and to create an environment for slow growth, to avoid imperfections from forming. In the laboratory the single crystals are generally grown either by cooling, evaporation, or dialysis. Inorganic salts, such as sodium chloride or ammonium sulfate, and polymers such as polyethylene glycol are almost always used to induce supersaturation (salting out).

These methods suffer from thermal and concentration gradients which cause convection currents that lead to imperfections in the crystals. The method of dialysis uses a membrane which allows salts to permeate to the protein solution, causing salting out. But this method does not apply to those proteins which require polyethylene glycol or other organic substances for the onset of nucleation. In the recent past, researchers, under the auspices of the National Aeronautics and Space Administration (NASA), have performed studies in microgravity with promising results. Whether microgravity can be a viable source for single crystals is doubtful, however, due to lack of access to long-duration space flights.

Therefore, the absence of a technology for growing large single crystals of proteins is a bottleneck in the progress of biotechnology. The pharmaceutical and the biotechnology industries in particular, as well as academic researchers, would benefit greatly from the development of a reliable method for making crystals, especially of proteins.

SUMMARY OF INVENTION

Thus, one aspect of this invention provides a method for making crystals, preferably single crystals, of crystallizable materials comprising osmotically removing the solvent from a solution of the crystallizable solute. A particular aspect of this invention provides such a method for making crystals, preferably single crystals, of proteins and polypeptides.

Upon further study of the specification and appended claims, further objects and advantages of this invention will become apparent to those skilled in the art.

BRIEF DESCRIPTION OF THE DRAWINGS

Various other objects, features and attendant advantages of the present invention will be more fully appreciated as the same becomes better understood when considered in conjunction with the accompanying drawings in which like reference characters designate the same or similar parts throughout the several views, and wherein.

DETAILED DESCRIPTION OF THE INVENTION

Figure 1:
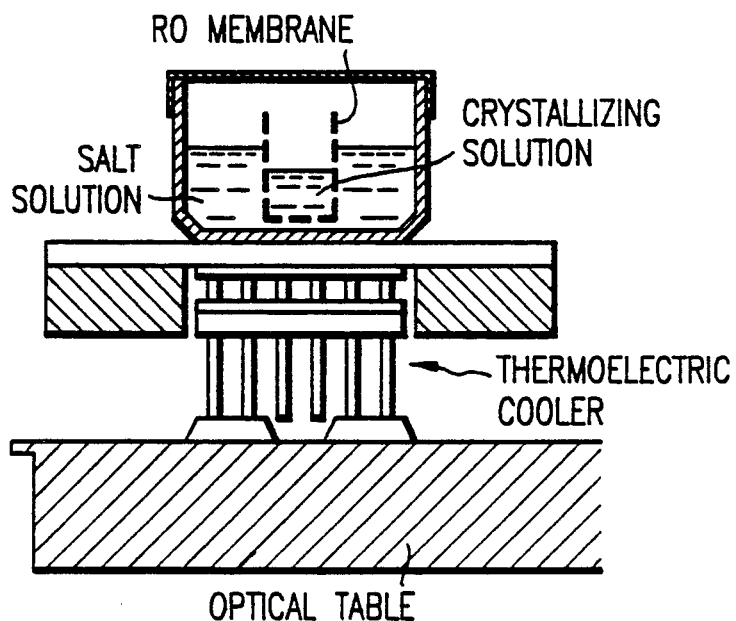
FIG. 1 shows the experimental set-up for the experiments described in Example 1.

In the present invention, an osmotic membrane controls solvent transport between two solutions. In a preferred aspect, an inner chamber contains a protein to be crystallized and a salt (sodium chloride or ammonium sulfate, for example). Polyethylene glycol may also be present. The outer chamber contains a more concentrated salt solution (FIG. 1). When the two solutions are separated by a semipermeable membrane of low molecular weight cut-off, because of the difference in osmotic pressures of the two solutions, solvent will flow out of the inner chamber containing the solute into the more concentrated outer chamber. This process is very slow and takes days, sometimes a few weeks, to bring the solution containing the solute to the point of supersaturation. Since the osmotic flow of solvent is the only transport event, the inner chamber is quiescent and essentially free from convection currents, creating an environment conducive to single crystal growth. In the experimental set-up shown in FIG. 1, a crystallizing solution contained in a vessel formed of a reverse osmotic membrane material is placed in a salt solution in a vessel. The level of the crystallizing solution is initially lower than the level of the salt solution on the other side of the membrane. A sheet of plastic wrap is shown extending over the top of the vessel to prevent evaporation of the solvent in the solution. The vessel rests on a thermoelectric cooler to maintain the temperature fairly constant, and the entire set-up rests on an optical table. This set-up was used in the experiment described in Example 1 herein.

Figure 3:
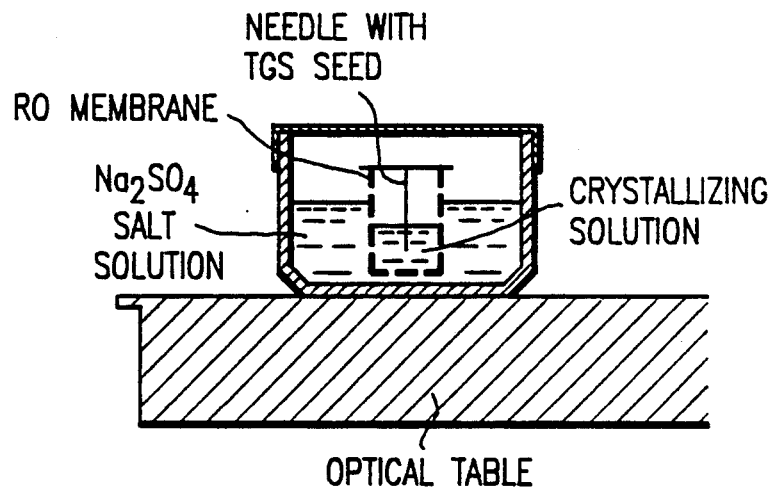
FIG. 3 shows the experimental set-up for the experiments described in Example 3.

In the experimental set-up shown in FIG. 3, a container formed of a reverse osmotic membrane is shown with a crystallizing solution therein of triglycerine sulfate (TGS). A needle with a TGS seed is shown extending into the TGS solution. This container is shown in a larger vessel containing a $Na_2SO_4$ salt solution, and the vessel is resting on an optical table.

In a preferred aspect, the product of this technique consists of perfect single crystals of protein suitable for X-ray diffraction and neutron scattering studies.

In a preferred aspect, the solvent is water, and the process is called osmotic dewatering. This dewatering technique can, however, be also used for making single crystals of low molecular weight inorganic salts and organic salts (such as triglycine sulfate). In the case of organic crystals, water may be replaced by an organic solvent.

Thus, this technique (osmotic solvent removal) provides a generic method for growing perfect crystals, especially of proteins.

In another preferred aspect, this invention provides an osmotic dewatering technique which exploits the selective transport of only water through a semipermeable membrane of special characteristics. Reverse osmosis (RO) membranes are widely used commercially to obtain potable water from brackish water. Thus, this invention utilizes the principle of osmosis, using commercially available RO membranes. Osmosis is the slow transfer of water through the membrane by the solution-diffusion mechanism. Water dissolves in the membrane and diffuses away to the permeate side as the consequence of a difference in the chemical potential between the two sides. Solutes such as sodium chloride, which do not dissolve in the membrane, do not, in principle, transport across an osmosis membrane. In practice, however, membranes only approximate this ideal. Thus, an osmotic membrane suitable for this invention will generally exhibit a salt rejection of $\geq 95\%$, meaning that at least 95% of the sodium chloride will be retained by the membrane, and $\leq 5\%$ will traverse the membrane.

Dialysis and ultrafiltration, which are also used for protein crystallization in the laboratory, take advantage of membranes which are more porous than RO membranes. The porosity of these more porous membranes is characterized by a molecular weight cut-off number. Thus, a 10,000 molecular weight cut-off membrane theoretically blocks all molecules bigger than 10,000 daltons, while letting all smaller molecules pass through. The essence of the dialysis methods for protein crystallization is to let salt molecules diffuse through a membrane into a protein solution to cause nucleation (salting out). The difference between the osmotic dewatering (or solvent removal) and the dialysis methods is that in the former only water (or other solvent) transports, and nucleation takes place because of concentration, whereas in dialysis, salts move through the membrane along with water (or other solvent) and nucleation results from salting out. As mentioned above, the membranes are also very different. In one prior method, called concentration dialysis (A. McPherson in "Preparation and Analysis of Protein Crystals", page 98, John Wiley & Sons, NY, 1982), a 10,000 molecular weight cut-off membrane is used. That membrane will not work in the osmotic dewatering (or solvent removal) method.

The advantages of the present invention are as follows:

1. Since osmosis is slow, a slow approach to supersaturation is guaranteed. Slow growth which results from this operation ensures growth of large single crystals.
2. Since convection currents are minimized, multi-crystal growth and dendrite formation are minimized. In processes which use a chemical reaction to induce nucleation, a steep concentration gradient is created, leading to massive nucleation, smaller crystals and multi-crystal formation.
3. The method is easy to perform. Once an experiment is set up, no supervision is necessary.
4. The growth rate of crystals can be easily controlled by controlling the concentration of salt in the external solution. The process can even be reversed to reduce the size of crystals.
5. The technique is potentially applicable to a wide variety of proteins, as well as to a vast array of inorganic and organic compounds.

Suitable solvents for this invention are those which are compatible with both the membrane and the material of interest to be crystallized, such that the membrane remains intact and the material of interest is maintained in a non-denatured or intact form. These may include polar and non-polar solvents, e.g., water, alcohols, benzene, toluene, phenol, esters, etc. In addition, the solution may further comprise polyethylene glycol.

In general, the presence of a salt in admixture with the substance to be crystallized is merely preferred. Crystallization can be conducted by the osmotic dewatering method of this invention without salting out the substance to be crystallized. The salting out expedient, on the other hand, shortens the time for crystallization to occur.

Suitable salts are those which facilitate the salting-out process, which are compatible with the solvent, the membrane and the material to be crystallized. Non-limiting examples include NaCl, KCl, sodium sulfate and ammonium sulfate. In fact, any soluble salt that reduces the solubility of proteins in solution, in principle, will work.

Suitable concentrations for the salt and material of interest for crystallization will vary depending on the nature of the materials and are routinely determinable by one of skill in the art. In general, the difference in concentration between the salt concentration containing the material to be crystallized and the higher concentration salt solution will be dependent on the membrane (i.e., the sodium chloride rejection), the solute, its solubility in the solvent, and the rate of osmosis desired. This method, for a chosen solute-solvent system and a membrane, allows one to combine the rate of solvent removal by controlling the salt concentration in the outside chamber. For lysozyme, for example, 0.3 mole% NaCl in the inside solution containing the protein, and 12 mole% NaCl in the outside solution provides osmotic dewatering in times that are reasonable, for example, a week or less. Changing the outside salt concentration to 8 mole%, however, makes the dewatering rate so slow that crystals form only after several weeks.

In addition, optimization of other conditions, such as, for example, temperature and pressure, is routinely determinable, and generally will be such that, whatever condition is chosen, it must remain constant throughout the crystallization to prevent convection currents or other disturbances in the solution while the crystals are growing. Thus it will generally be desirable to have the method performed in a stable environment, including the use of, for example, a vibrationless table.

A further possibility is the simultaneous use of prior art techniques for enhancing crystallization, such as the use of seed crystals.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire texts of all applications, patents and publications, if any, cited above and below, and of corresponding application(s) are hereby incorporated by reference.

EXAMPLES

Example 1: Comparative Crystallization of Lysozyme

In this example, the protein lysozyme was crystallized by a conventional method, and by the present technique of osmotic dewatering. The conventional method is based on high supersaturation at the start of the experiment. In contrast, in our technique the supersaturation is slowly approached by dewatering. Lysozyme Grade I from chicken egg white was purchased from Sigma Chemical Company, St. Louis, MO. with no further treatment. In the osmotic dewatering experiments (Test Examples A and B), a reverse osmosis membrane, Sepamembrane MS02 made by Osmonics, Inc., Minnetonka, Minnesota, was used.

Comparative Example A 5 ml of 0.04M, pH 4.5 acetate buffer as first added to 400 mg of lysozyme and was stirred slowly for five minutes to avoid frothing. 5 ml of 10% (w/v) NaCl solution was then added to the mixture over a period of five more minutes with stirring. This final solution was then filtered into a plastic container and allowed to stand at room temperature for two days (reference for lysozyme recipe: ""Protein crystallography: Crystallization of Proteins, Blundell & Johnson, Academic Press, 1986, page 69). After this period the crystals were observed. The conventional crystals were smooth tetragonal crystals averaging about 0.08 mm in length.

Test Example A

Figure 2A:
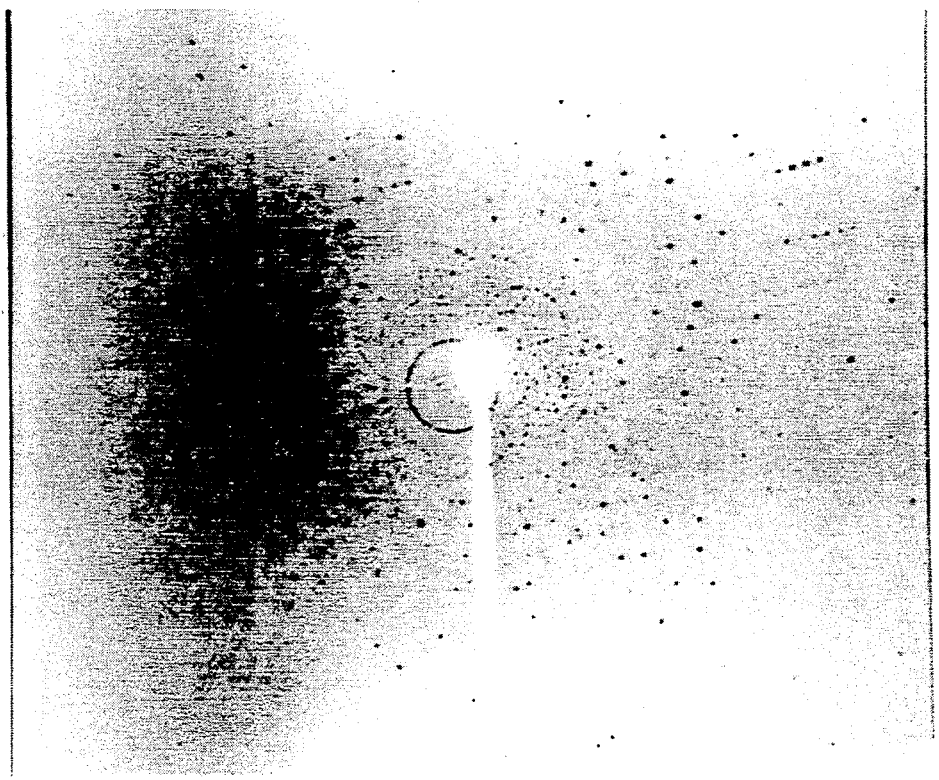
FIG. 2a is the diffraction pattern of a crystal of lysozyme grown in Solution A of Example 2.
Figure 2B:
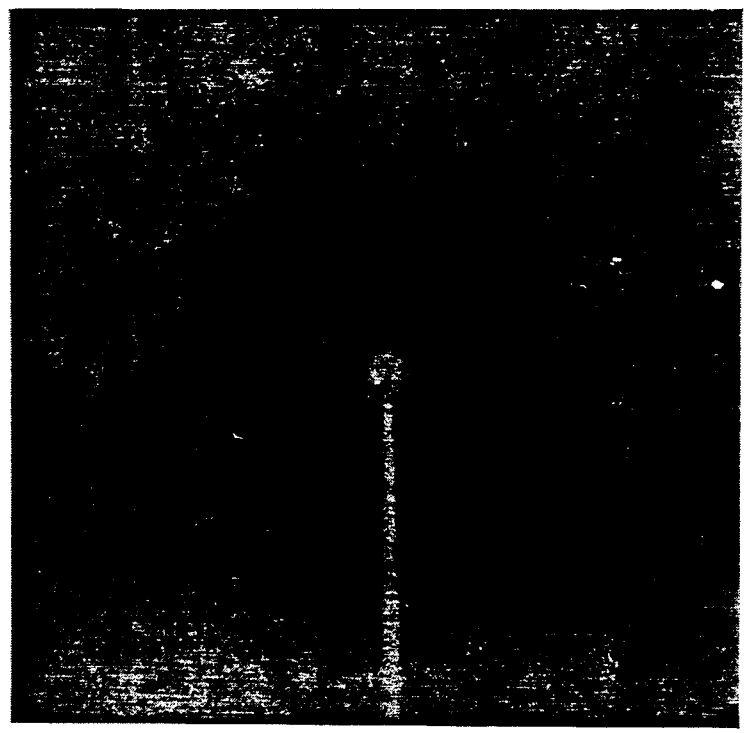
FIG. 2b is the diffraction pattern of a crystal of lysozyme grown in Solution B of Example 2.
Figure 2C:
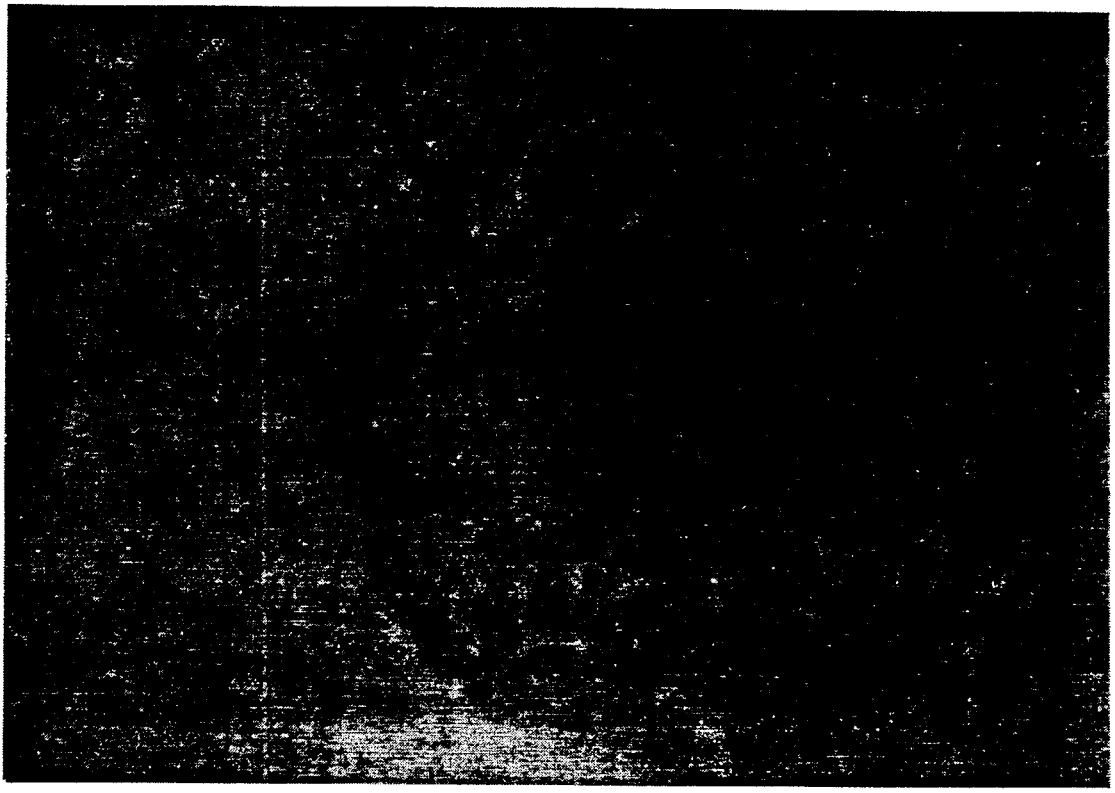
FIG. 2c is the precession pattern of the diffraction study of a crystal of lysozyme grown in Solution C of Example 2, in precessional motion.

In this experiment the reverse osmosis membrane was fashioned into a cone. The cone was placed into a small pyrex fishbowl. In the interior was a solution of 400 mg of the protein, 5 ml of acetate buffer and 10 ml of 5% (w/v) NaCl mixed similarly to the conventional method. On the outside of the cone was 100 ml of 25% (w/v) NaCl. The cone/fishbowl configuration was then covered with a sheet of plastic wrap and taped closed. This was then set at room temperature which is around 20° C. It takes approximately one week for 5 ml of dewatering to occur and the crystals to form. The crystals were then removed and viewed. Their approximate length was 0.3 mm (please see FIG. 2).

Test Example B

In this experiment the membrane was fashioned into a cylinder. Because of hot weather 20° C. was difficult to maintain, and the experiment was moved to the refrigerator. An inner solution of 400 mg of lysozyme, 5 ml of buffer and 10 ml of 4% (w/v) NaCl were mixed as in the conventional method. The outer solution was 100 ml of 25% (w/v) NaCl. The cylinder containing the protein solution was dipped into the bowl of concentrated salt solution and was sealed and put into the refrigerator for about seven days at approximately 9° C. The crystals were then observed and found to be of the same relative size as the crystals made in the cone.

Example 2: Lysozyme Crystallization Under Various Conditions

Lysozyme Grade I from chicken egg white was purchased from Sigma Chemical Company, St. Louis, MO. with no further treatment.

The reverse osmosis membrane was purchased from Osmonics, Inc., Minnetonka, MN. Sepa MS03-42406.

The membranes were shaped into cylinders closed at one end, using polyurethane bond glue. The membranes were positioned in the center of a round fingerbowl, with the solution on the outside consisting of 25% NaCl. The cylindrical membrane was filled with the supersaturated protein solution to a level below that of the outside solution. A parafilm lid was placed over the fingerbowl to prevent evaporation. The bowl was then placed onto a vibrationless optical table and maintained at a temperature between 16°–18° C. by a thermoelectric cooler (see FIG. 1).

A number of different solutions were tested with various salt and protein concentrations and with various results. Table 1 describes three solutions that produced high quality crystals and the procedures that were used. Initial success with solution A was repeated and hastened by varying the outside concentrations. After seven days the outside concentration was altered by removing 20 percent of its volume and replacing it with a higher concentration of salt. This increased the osmotic pressure gradient, allowing further dewatering of the inner solution.

Table 1 outlines the experimental parameters for each solution. The solutions were made up in a 0.1 M acetate buffer at pH 4.0. Final concentrations were determined by volumetric analysis.

TABLE 1

Three Sets of Conditions Used For Growing Lysozyme Crystals By Osmotic Dewatering

| Soln. # | Days run | Outside soln. Change | Protein Conc. initial (%) | Protein Conc. final (%) | Salt Conc. initial (%) | Salt Conc. final (%) |
|---|---|---|---|---|---|---|
| A | 13 | NO | 2.0 | 7.9 | 2.0 | 7.9 |
| B | 9 | YES | 4.0 | 7.3 | 2.0 | 3.6 |
| C | 9 | YES | 3.3 | 8.2 | 1.5 | 3.8 |
| D | 9 | YES | 3.4 | 10.0 | 2.0 | 7.9 |

Results and Conclusion

High-quality crystals were obtained from this procedure for the range of solute concentrations shown in Table 1. Crystals from solutions A-C were tested for quality by X-ray diffraction. Even though large crystals were grown in solution D, as shown in Table 2, microscopic inspection revealed dislocations characteristic of inferior quality crystals. From these results, as well as those from less successful runs, the ideal final protein concentration for lysozyme was determined to be between 7.5% and 8.0%. The value for the final salt concentration in solution A may be higher than necessary.

The quality of the crystals was confirmed by X-ray diffraction studies. Diffraction patterns labeled A, B and C in FIG. 2 correspond respectively to crystals grown in solutions A, B and C. The precession pattern C is the diffraction study of a crystal from solution C in precessional motion. The diffraction pattern A shows strong reflections about 79 mm from the center. This corresponds to a resolution of 1.73 angstroms. The diffraction pattern B and the precession photograph C have approximately the same resolution as the X-ray diffraction A.

TABLE 2

Results of Visual Microscopic Evaluation of Lysozyme Crystals Grown Using Conditions A, B and C in Table 1

| | Forms Present in Solution | | | | |
|---|---|---|---|---|---|
| | | Crystals | | | Ave. Size |
| Soln. | Amorphous | Fragmented | Clumps | Single | of Crystals |
| A | no | 10% | no | 90% | 0.37 mm |
| B | 10% | 50% | no | 40% | 0.5 mm |
| C | 10% | 5% | 30% | 55% | 0.5 mm |
| D | 5% | 50% | 20% | 25% | 0.875 mm |

Experiment 3: Triglycine Sulfate Crystallization

Materials: Triglycine sulfate (TGS) was purchased from Quantum Technologies, Sanford, Fl., and used with no further treatment.

The reverse osmosis membrane (Sepa MS03-42406) was purchased from Osmonics, Inc., Minnetonka, MN.

The membranes were shaped into cylinders closed at one end using polyurethane bond glue. The membranes were positioned in the center of a round fingerbowl, with the solution on the outside consisting of 25% NaCl. The cylindrical membrane was filled with the supersaturated TGS to a level below that of the outside solution. A TGS crystal seed was glued to a needle suspended from a paper bridge across the membrane. A parafilm lid was placed over the fingerbowl to prevent evaporation. The bowl was then placed onto a vibrationless optical table at room temperature (see FIG. 3).

A number of solutions were run with differing salt concentrations. Each solution produced at least one TGS crystal. In each solution the TGS was dissolved in deionized water. The dewatering rate was determined by a concentration gradient set up using 1M $Na_2SO_4$. Table 2 describes two solutions and the procedures that were used.

TABLE 2

Two Sets of Conditions Used for Growing TGS Crystals by Osmotic Dewatering

| Soln. # | Time (hr) | Outside $Na_2SO_4$ conc. | Amount of TGS per 11 ml $H_2O$ | Crystal Size (cm) |
|---|---|---|---|---|
| 1 | 6 | 1M | 3.1 g | 0.5 |
| | 29 | 1M | | 0.5 |
| 2 | 6 | 1M | 3.1 g | 0.5 |
| | 29 | 1.5M* | | 0.9 |

*(after 6 hrs $Na_2SO_4$ was increased to 1.5M)

Results

From the precedingly described results, it may be concluded that larger crystals of TGS can be grown by increasing the $Na_2SO_4$ concentration on the outside of the membrane. Furthermore, decreasing the $Na_2SO_4$ concentration caused the TGS crystals to dissolve back into the crystallizing solution. Therefore, osmotic dewatering works as an effective control over this process, capable of both enhancing and reversing crystal growth.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method for growing a protein crystal comprising bringing a first solution containing a first salt concentration in a solvent into contact with one side of a reverse osmosis membrane which is in contact on its other side with a second solution containing a second, lower salt concentration in a solvent, which second solution additionally contains said protein to be grown into a crystal, said reverse osmosis membrane having a salt rejection of >95%, said first salt concentration being sufficiently greater than the second salt concentration to provide a difference in osmotic pressures of the two solutions and an osmotic flow of the solvent from the second solution to the first solution, said second solution being maintained in an essentially quiescent state, and carrying out the method in an airtight environment to prevent any substantial evaporation of solvent from the solution.

2. A method of claim 1, wherein the substance to be grown into a crystal is a lysozyme.

3. A method of claim 1, wherein the solvent is a polar solvent.

4. A method of claim 1, wherein the solvent is an organic solvent.

5. A method of claim 3, wherein the solvent is water.

6. A method of claim 1, wherein the salt is sodium chloride, sodium sulfate or ammonium sulfate.

7. A method of claim 1, further comprising initiating crystallization with a seed crystal of protein.

8. A method of claim 1, said second solution further comprising polyethylene glycol.

9. A method of claim 1, wherein the second solution contains a protein to be crystallized and an inorganic salt, and the reverse osmotic membrane has a low molecular weight cutoff.

10. A method of claim 1, wherein the same salt is present in the first and second solutions.

11. A method of claim 10, wherein said salt is NaCl.

12. A method of claim 10, wherein said salt is KCl.

13. A method of claim 10, wherein said salt is $Na_2SO_4$.

14. A method of claim 10, wherein said salt is ammonium sulfate.

* * * * *